United States Patent [19]

Birrittella

[11] Patent Number: 4,656,495
[45] Date of Patent: Apr. 7, 1987

[54] BIPOLAR RAM CELL AND PROCESS

[75] Inventor: Mark S. Birrittella, Phoenix, Ariz.

[73] Assignee: Motorola Inc., Schaumburg, Ill.

[21] Appl. No.: 750,121

[22] Filed: Jul. 1, 1985

[51] Int. Cl.[4] .................. H01L 29/72; G11C 11/00
[52] U.S. Cl. .................................. 357/34; 357/36; 357/44; 365/154
[58] Field of Search .................. 357/34–36, 357/44, 46, 89, 90; 365/154–156

[56] References Cited

U.S. PATENT DOCUMENTS 4,045,248 8/1977 Shannon et al. .................. 357/89

FOREIGN PATENT DOCUMENTS 0029717 6/1981 European Pat. Off. .

OTHER PUBLICATIONS

IBM Technical Disclosure Bulletin vol. 24, #1A, Jun. 1981, pp. 85–87 by Denis et al.
Sakai et al., "A 3-ns 1K-Bit RAM Using Super Self-Aligned Process Technology" Oct., 1981, IEEE Journal of Solid State Circuits, vol. SC-16, No. 5, pp. 424–429.
Inadachi et al., "A 6ns 4Kb Bipolar RAM Using Switched Load Resistor Memory Cell" 1979, IEEE Internat'l Solid State Circuit Conference, pp. 108–109.
Hotta et al., "A High-Speed Low Power 4096 x 1 Bit Bipolar RAM", Journal of Solid State Circuits, vol. SC-13, No. 5 Oct., 1978, pp. 651–655.
Toyoda et al., "A 15ns 16Kb ECL RAM with a PNP Load Cell" IEEE International Solid State Circuits Conference, Feb. 1983, pp. 108–109.
Kato et al., "A 16ns 16K Bipolar RAM" IEEE Internat'l Solid State Circuits Conference, Feb. 1983, pp. 106–107.
Toyoda et al., "A High Speed 16 Kbit ECL RAM" IEEE Journal of Solid St. Circuits, vol. SC-18, No. 5, pp. 509–514.

Primary Examiner—Andrew J. James
Assistant Examiner—Mark Prenty
Attorney, Agent, or Firm—John A. Fisher; Raymond J. Warren

[57] ABSTRACT

An integrated bipolar RAM cell and process for its manufacture is disclosed. The RAM cell includes first and second cross-coupled bipolar transistors with first and second load elements coupled to the collectors of the first and second transistors, respectively. The load elements can be, for example, diode clamped resistors or lateral PNP transistors. The load elements include regions which are capable of injecting minority carriers into the collectors of the first and second transistors. To avoid charge storage problems and associated reduced switching speed while maintaining high voltage noise immunity, the charge injecting regions are fabricated having an integrated impurity doping less than or equal to about $1 \times 10^{13}$ cm$^{-2}$.

3 Claims, 8 Drawing Figures

BIPOLAR RAM CELL AND PROCESS

BACKGROUND OF THE INVENTION

This invention relates generally to a bipolar RAM cell and to a process for its fabrication, and more specifically to an integrated bipolar RAM cell having reduced charge storage while maintaining high voltage noise immunity and to a process for its manufacture.

A commonly used bipolar static RAM cell is basically a flip-flop circuit consisting of cross-coupled multi-emitter NPN transistors with load elements coupled to the transistor collectors. Attempts are made to configure the cell for both low power consumption and high speed. Standby current must be supplied to the selected transistor in the flip-flop to generate an appropriate voltage drop in the load element and thus to retain data in the cell. To keep the total power dissipation of the memory at an acceptably low level, the standby current must be made low. If the load element is a resistor, the low standby current is achieved by using a high value resistor. Unfortunately, the bit line to which the memory cell is connected generally has a high parasitic capacitance; the high value load resistance in combination with the high parasitic capacitance tends to limit the operating speed of the memory. A high read current must therefore be supplied to the memory cell to enable fast switching of the bit line.

To attain both goals of a low standby current and a high read current for fast switching, a parallel load element including a resistive load shunted by a diode has been widely used. The standby current flows through the resistive load which has a high resistance value to minimize the standby current and to generate a high noise immunity required for retaining data. The high read current is shunted through the diode portion of the load.

An alternate memory cell uses a lateral PNP transistor as a load element replacing the resistor and parallel diode. The PNP load allows a high read current as well as a low standby current and may allow a smaller cell size because the PNP transistor can generally be made in an area less than that required for the large load resistor.

In fabricating the foregoing RAM cells, space considerations dictate that one of the load elements and one of the NPN transistors be fabricated in a single isolated region. Within that isolated region, the load diode or the PNP emitter are fabricated by the same diffusion or ion implantation used for fabricating the base of the NPN transistor. The base of the lateral PNP transistor and the cathode of the diode are common with the collector of the NPN transistor. Thus, the load diode and PNP emitter-base diode are essentially the same as the base-collector diode of the NPN transistor. Structures fabricated in this manner, however, are subject to excessive charge storage which occurs when large read currents flow through either the diode or the PNP emitter. The charge storage results from injection of minority carriers from the anode region of the diode or the PNP emitter region into the epitaxial collector region of the NPN transistor. This charge storage results in a long write pulse and long write recovery time because the excess charge must be withdrawn or recombine before the cell information can be rewritten. This, in turn, prevents these cells from being useful in high speed applications.

In one attempt to overcome this problem, the PN junction diode load element has been replaced by a Schottky clamping diode. The Schottky clamping diode, being basically a majority carrier device, is characterized by low minority carrier injection and thus is not subject to excessive charge storage. Unfortunately, the forward "on" voltage of the Schottky diode is in the range of 300–500 mV in contrast to the "on" voltage of the PN junction diode which is in the range of about 600–900 mV. The forward voltage of the clamping diode sets the noise immunity of the cell. The Schottky diode clamped cell thus has a lower voltage noise immunity which causes it to be disturb/pattern sensitive.

In view of the need for a bipolar RAM cell for high speed application which does not sacrifice low power dissipation or high voltage noise immunity, an improved RAM cell which overcomes the difficulties of existing RAM cells was needed.

It is therefore an object of this invention to provide an improved integrated bipolar RAM cell capable of operating in high speed applications.

It is another object of this invention to provide an improved process for fabricating an integrated bipolar RAM cell.

It is yet another object of this invention to provide an integrated bipolar static RAM cell having high voltage noise immunity and improved switching speed.

BRIEF SUMMARY OF THE INVENTION

The foregoing and other objects and advantages of the invention are achieved with an integrated bipolar RAM cell fabricated to have a limited amount of minority carrier injection during a read operation. The RAM cell, in accordance with the invention, includes first and second cross-coupled bipolar transistors. First and second load elements are coupled to the collectors of the first and second transistors, respectively, with the load elements including regions capable of injecting minority carriers into the collectors of the first and second transistors, but with the regions characterized by an integrated impurity doping less than or equal to about $1 \times 10^{13}$ cm$^{-2}$. The injecting region of limited doping avoids excessive minority carrier injection without unduly sacrificing noise immunity.

BRIEF DESCRIPTION OF THE DRAWINGS

FIGS. 1–3 schematically illustrate implementation of prior art bipolar RAM cells, while

DETAILED DESCRIPTION OF PREFERRED EMBODIMENT

Figure 1:
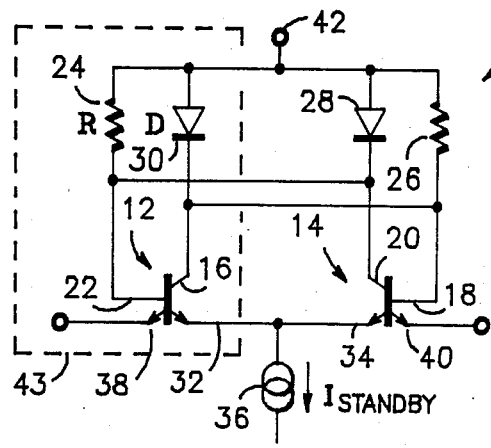

FIG. 1 illustrates schematically a bipolar static RAM memory cell 10 in accordance with the prior art. The memory cell includes cross-coupled NPN transistors 12 and 14. Collector 16 of transistor 12 is coupled to the base 18 of transistor 14. In like manner, collector 20 of transistor 14 is coupled to base 22 of transistor 12. Load resistors 24 and 26 are coupled to the collectors of transistors 14 and 12, respectively. Diodes 28 and 30 are coupled in parallel with load resistors 24 and 26, respectively. Emitters 32, 34 are coupled to a standby current generator 36. Additional emitters 38, 40 are available for coupling to first and second bit lines, respectively. Load devices 24, 26, 28, 30 are coupled together at terminal 42 which is coupled to a word line (not shown).

Figure 1A:
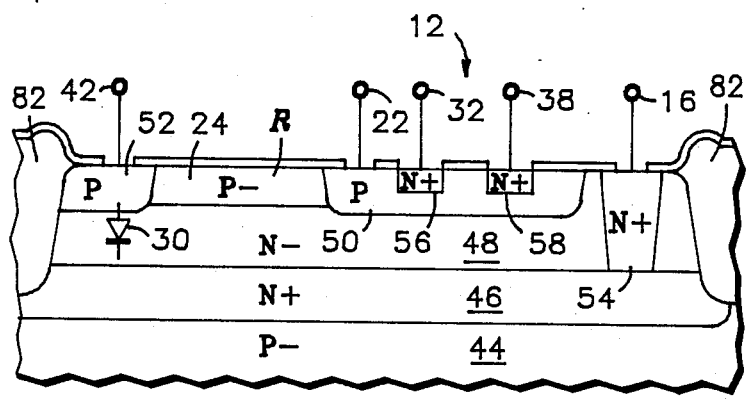
FIGS. 1A, 2A, 3A illustrate, in cross section, the integrated implementation of those cells.

FIG. 1A illustrates, in cross section, the integrated implementation of one-half 43 of memory cell 10. The other half is implemented in like manner and the two halves are then interconnected. The half of the memory cell illustrated is fabricated in an isolated region of silicon at a surface of a semiconductor slice. The structure is fabricated on a lightly doped P− substrate 44. Overlying substrate 44 is a localized, heavily doped N+ buried layer 46. An N− epitaxial region 48 is grown overlying buried layer 46. Buried layer 46 and epitaxial layer 48 form the collector of transistor 12 as well as the cathode of diode 30. P regions 50 and 52 are diffused, ion implanted, or otherwise doped at the surface of epitaxial layer 48 to form the base of transistor 12 and the anode of diode 30. Heavily doped N+ region 54 provides a low resistance contact to the collector of transistor 12. P type resistor region 24 is formed at the surface of epitaxial layer 48 by ion implantation. Emitters 32 and 38 are formed by ion implanting and diffusing heavily doped N+ regions 56, 58 into the surface of P type base region 50.

The completed structure, of course, includes the appropriate metallization, passivation, and the like which is well known in the semiconductor art and need not be discussed in detail.

In the operation of memory cell 10, one of the diodes 28, 30 becomes forward biased during a read operation. The forward biasing of diode 30, for example, causes the injection of minority carriers into N type epitaxial layer 48. A subsequent write operation requires that these excess carriers be removed or recombine before the write can be accomplished. The write cycle, therefore, must be long enough to accommodate the removal of the excess carriers.

Figure 2:
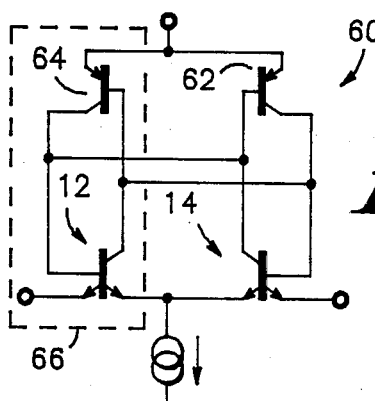

FIG. 2 illustrates a further prior art bipolar RAM cell 60. For convenience, similar device regions have been designated by the same numbers throughout. This embodiment includes cross-coupled NPN devices 12 and 14. Load devices 62 and 64 are lateral PNP transistors coupled in series with the collectors of transistors 12 and 14, respectively.

Figure 2A:
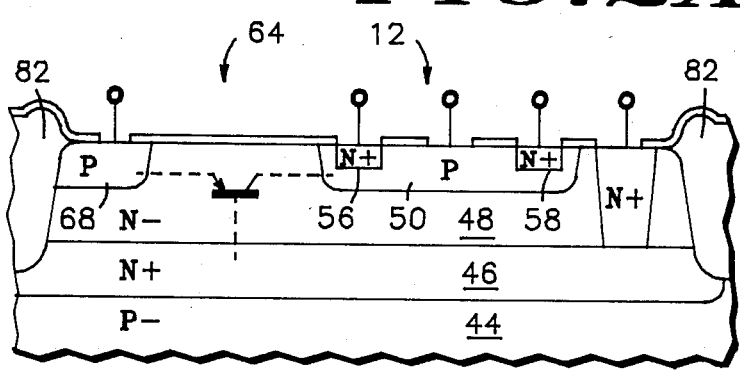

FIG. 2A illustrates, in cross section, the fabrication of the half cell 66. Transistor 12, including buried layer 46, epitaxial collector layer 48, base region 50 and emitter regions 56, 58 are formed as described above. Base region 50 also forms the collector of lateral PNP transistor 64. Epitaxial collector region 48 also forms the base of the PNP transistor. Emitter region 68 is formed by diffusion or ion implantation at the same time as is base region 50.

In the operation of memory cell 60, during a read operation the emitter base junction of lateral PNP 64 is forward biased, injecting carriers into the N type epitaxial layer 48. Like the diode clamped resistor load cell of FIG. 1, the injection of minority carriers requries a lengthened write cycle to allow the injected carriers to either recombine or be withdrawn before the state of the memory cell can be rewritten.

Figure 3:
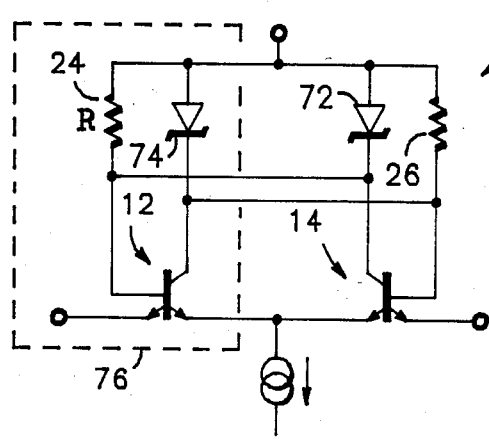
Figure 3A:
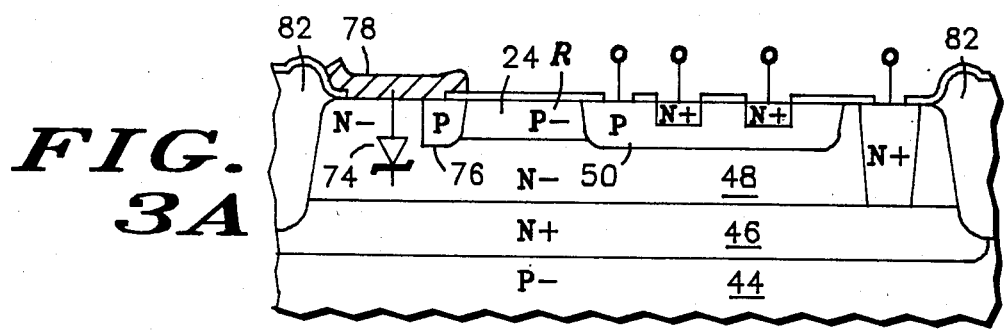

FIG. 3 illustrates schematically a bipolar RAM cell 70 designed to overcome the problems attendant with charge injection in the above described memory cells. The RAM memory cell includes cross-coupled NPN transistors 12 and 14 and load resistors 24, 26. In place of PN junction clamp diodes, however, Schottky diodes 72, 74 parallel the load resistor 24, 26, respectively. FIG. 3A illustrates, in cross section, fabrication of the half cell 76. Transistor 12 and resistor 24 are fabricated as described above and illustrated in FIG. 1A. Schottky diode 74 is fabricated by forming a Schottky metal-semiconductor junction. The metal employed can be aluminum, platinum silicide or other silicide, or the like. P region 76, formed by diffusion or ion implantation simultaneously with base region 50 serves to enhance the ohmic contact between metal 78 and the end of resistor 24.

During operation of the memory cell, and specifically during a read operation, the low forward voltage of the Schottky diode causes diode 74 to turn on, clamping the voltage at the Shottky turn-on voltage, before the diode formed between region 76 and epitaxial layer 48 can turn on and begin injecting. Because Schottky diode 74 is a majority carrier device, little or no minority carrier injection into region 48 occurs. Unfortunately, the low forward voltage of the Schottky diode also leads to low noise immunity of the memory cell and makes the cell susceptible to inadvertent disturbs of the memory state.

Figure 4:
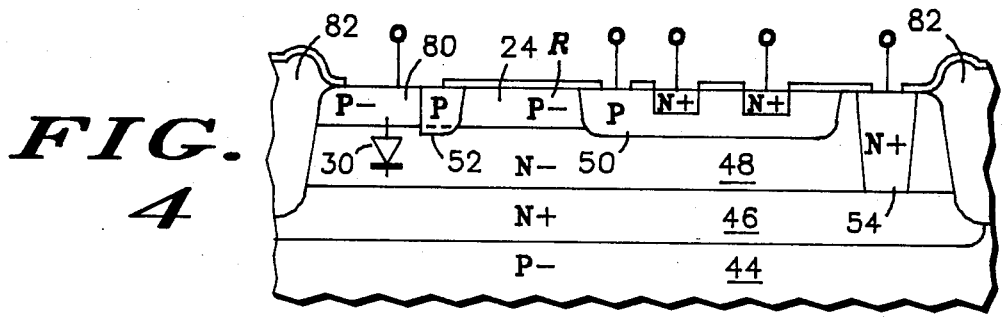
FIGS. 4 and 5 illustrate, in cross section, integrated implementation of two bipolar RAM cells in accordance with the invention.

FIG. 4 illustrates, in cross section, the fabrication of half a memory cell in accordance with one embodiment of the invention. Schematically, the memory cell in accordance with this embodiment of the invention appears identical to memory cell 10 illustrated in FIG. 1. In accordance with the invention, however, clamp diode 30 is fabricated by diffusing or ion implanting a lightly doped P region 80 into the epitaxial layer 48. P region 80 has an integrated impurity doping less than or equal to about $1 \times 10^{13}$ cm$^{-2}$ to limit minority carrier injection into N region 48 without seriously lowering the noise immunity of the cell.

The amount of minority carrier injection is an exponential function of the voltage impressed across the diode. By limiting the impurity doping in region 80, the "turn-on" voltage of diode 30 is slightly lowered; this has a significant effect on carrier injection because of the exponential relationship of carrier injection to forward voltage.

In a preferred embodiment, the memory cell in accordance with the invention is fabricated on a P type silicon susbstrate having a resistivity of about 3–25 ohm cm. A heavily doped N type buried layer 46 is selectively formed at the surface of substrate 44. An N type epitaxial layer 48 having a thickness of about 0.8–2.5 micrometers and a resistivity of about 0.4 ohm cm is grown overlying the buried layer and substrate. Isolation means 82 are formed extending through the epitaxial layer and buried layer to the underlying substrate to electrically isolate individual portions of the integrated structure. The isolation can be diffused junction isolation, recessed oxide isolation, refilled groove isolation, or the like. Although the type of isolation is not critical to the invention, it is preferred that the isolation region 82 be comprised of an insulating material. A deep, heavily doped N type diffusion 54 provides a low resistance contact extending from the surface to the buried layer.

A base region 50 is diffused or ion implanted at the surface of epitaxial layer 48. The same diffusion or ion implantation can be used to form a resistor contact region 52 which aids in making contact to the end of a resistor region 24. Resistor region 24 is formed, preferably by ion implantation, to form the high resistance value load resistor necessary for maintaining a low standby current. The anode region 80 of diode 30 is preferably formed simultaneously with resistor region 24. Both the anode region and resistor region are thus limited in impurity doping to an integrated impurity doping less than about $1 \times 10^{13}$ cm$^{-2}$. Preferably the anode and resistor are doped to an integrated doping value of about $6 \times 10^{12}$ cm$^{-2}$ by ion implantation. This is in contrast to the base region which has an integrated impurity doping of about $1 \times 10^{14}$ cm$^{-2}$ or higher.

Resistor contact region 52 and resistor region 24 form diode with epitaxial layer 48 which are in parallel with diode 30. These diodes do not inject an unacceptably high number of carriers into epitaxial layer 48 because diode 30 turns on at a lower voltage than does the diode formed between region 52 and layer 48. The voltage is thus clamped by diode 30, limiting injection from the parallel diode. The diode formed between resistor region 24 and layer 48 injects the same as does diode 30. In accordance with the invention, therefore, the load element is characterized by a region or regions capable of injecting minority carriers into the collector of the associated NPN transistor. The load element is further characterized by a region (or one of the regions) which controls the amount of carrier injection to an acceptable level; the region which controls the carrier injection is doped with an integrated carrier doping less than or equal to $1 \times 10^{13}$ cm$^{-2}$. The controlling region may be a part of or all of the region capable of injecting minority carriers.

Emitter regions 56 and 58 are then formed in base region 50 by diffusion or ion implantation in the normal manner. Overlying oxide layers and metal contacts have been illustrated only schematically in FIG. 4. These are formed in any conventional manner to complete the device. The other half of the memory cell, of course, is located in an adjacent electrically isolated surface region in a like manner. Interconnection between the halves of the memory cell are then effected by conventional semiconductor integrated circuit techniques.

Figure 5:
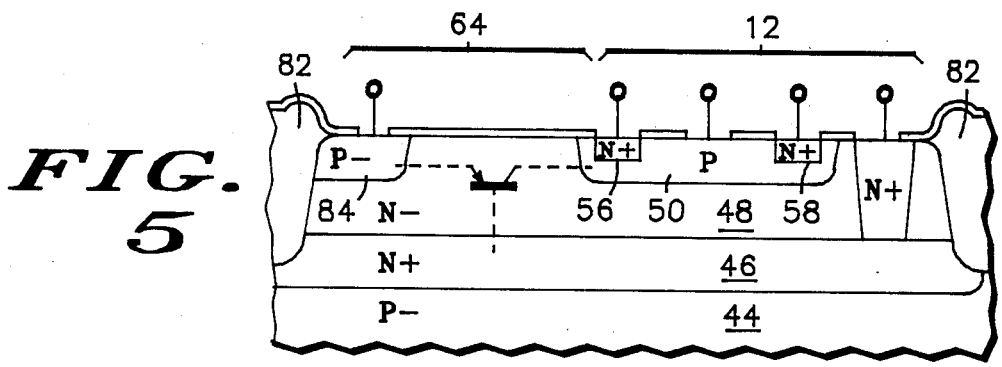

FIG. 5 illustrates, in cross section, the fabrication of one half of a bipolar RAM memory cell in accordance with a further embodiment of the invention. A schematic illustration of this embodiment of memory cell is substantially the same as memory cell 60 illustrated in FIG. 2. Fabrication of the memory cell proceeds in a manner similar to that illustrated in connection with FIG. 4 to form the buried layer, epitaxial layer, isolation, collector contact, and the base and emitter of NPN transistor 12. The base 50 and epitaxial layer 48 form the collector and base, respectively, of the lateral PNP transistor 64. The emitter of PNP transistor 64, however, is not formed simultaneously with base region 50. Emitter region 84 is formed by diffusion or preferably ion implantation to have an integrated impurity doping of about $1 \times 10^{13}$ cm$^{-2}$ or less. By limiting the impurity doping in emitter 84, the injection of minority carriers into epitaxial layer 48 during a read operation is limited. In this embodiment, the region controlling the level of minority 25 carrier injection is the whole of emitter 84.

In the fabrication of a conventional lateral PNP transistor, the emitter and collector are formed simultaneously by diffusion through openings in a diffusion mask. The diffusion mask openings are formed in one photolithography step so that the emitter and collector are self-aligned with respect to each other and the critical, narrow spacing between collector and emitter is determined by a single photolithography step. In accordance with the present invention, however, regions 84 and 50 are not formed simultaneously since emitter 84 has an integrated impurity doping less than or equal to about $1 \times 10^{13}$ cm$^{-2}$ and base region 50 generally has an integrated impurity doping greater than or equal to about $1 \times 10^{14}$ cm$^{-2}$. To insure that the emitter and collector are accurately aligned and that the narrows base width separating emitter and collector is preserved, a master mask technique can be employed to locate the two regions. In the master mask technique, in accordance with a preferred embodiment, a diffusion masking material is formed overlying the surface of epitaxial layer 48. Openings are formed photolithographically in the diffusion masking material corresponding to the placement of the PNP collector and emitter regions. The emitter region is then temporarily covered, as by a photoresist layer, while the combination NPN base and PNP collector region is ion implanted to the required dose. The photoresist is then removed from the PNP emitter region and that region is ion implanted to the second, lower dose. Both regions can then be simultaneously activated by a single activation anneal step.

Integrated bipolar ECL RAM were fabricated in accordance with the fabrication procedure outlined with respect to FIGS. 1A and 4. The devices were 4096 bit RAM. The devices were fabricated identically except for the doping of the clamp diode paralleling the load resistor in the memory cell. In one group of devices the diode anode region was doped to approximately $1 \times 10^{14}$ cm$^{-2}$ and in another group of devices the diode anode region was doped simultaneously with the load resistor to an impurity doping density of about $6 \times 10^{12}$ cm$^{-2}$. The device with the heavier anode implant was found to have a write cycle time of about 25–60 ns. Here the write cycle time is equal to the write pulse width plus the write recovery time. The device, in accordance with the invention, having a lightly doped diode region was found to have a write cycle time of less than 10 ns.

Thus it is apparent that there has been provided, in accordance with the invention, an improved integrated bipolar RAM cell and process for its manufacture which fully meets the objects and advantages set forth above. Although the invention has been described and illustrated with reference to specific embodiments thereof, it is not intended that the invention be limited to these illustrative embodiments. Those skilled in the art will recognize, after review of the foregoing detailed description, that variations and modifications differing from these illustrative embodiments are possible without departing from the invention. It is therefore intended to include within the invention all such variations and modifications as fall within the scope of the appended claims.

I claim:

1. An integrated bipolar RAM cell comprising: first and second cross-coupled multiple emitter NPN transistors, the base of said first transistor coupled to the collector of said second transistor and the base of said second transistor coupled to the collector of said first transistor, a first emitter of said first transistor coupled to a first bit line and a first emitter of said second transistor coupled to a second bit line, a second emitter of each of said first and second transistors coupled to current generator means; first and second PNP transistors coupled between the collector of said first and second transistors, respectively, and a word line, said first and second PNP transistors having emitter regions characterized by an integrated impurity doping less than or equal to about $1 \times 10^{13}$ cm$^{-2}$.

2. An integrated bipolar RAM cell which comprises: first and second cross-coupled bipolar transistors; and first and second PNP transistors coupled to the collectors of said first and second transistors, respectively, said PNP transistors including emitter regions capable of injection minority carriers into the collectors of said first and second transistors, said emitter regions forming PN junctions with said collectors, said emitter regions characterized by an integrated impurity doping less than or equal to about $1 \times 10^{13}$ cm$^{-2}$.

3. The RAM cell of claim 2 wherein one of said first and second bipolar transistors and one of said first and second PNP transistors are positioned in an isolated surface region of a semiconductor substrate.

* * * * *